(12) United States Patent
Horsky

(10) Patent No.: US 7,023,138 B2
(45) Date of Patent: *Apr. 4, 2006

(54) ELECTRON IMPACT ION SOURCE

(75) Inventor: Thomas N. Horsky, Boxborough, MA (US)

(73) Assignee: Semequip, Inc., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/748,078

(22) Filed: Dec. 30, 2003

(65) Prior Publication Data

US 2004/0195973 A1 Oct. 7, 2004

Related U.S. Application Data

(63) Continuation of application No. 10/183,768, filed on Jun. 26, 2002, now Pat. No. 6,686,595.

(51) Int. Cl.
*H01J 7/24* (2006.01)

(52) U.S. Cl. .................... 315/111.81; 250/281
(58) Field of Classification Search ........... 315/111.21, 315/111.31, 111.81, 111.91; 250/281, 492.2; 118/723 I; 378/65
See application file for complete search history.

(56) References Cited

U.S. PATENT DOCUMENTS

| | | | |
|---|---|---|---|
| 3,557,365 A | | 1/1971 | Mayo et al. ................ 250/427 |
| 3,581,195 A | | 5/1971 | Jepsen ......................... 324/470 |
| 4,120,700 A | | 10/1978 | Morimoto .................... 438/479 |
| 4,152,478 A | | 5/1979 | Takagi ......................... 428/221 |
| 4,217,855 A | | 8/1980 | Takagi ......................... 118/719 |
| 4,649,278 A | | 3/1987 | Chutjian et al. ......... 250/423 R |
| 4,686,365 A | * | 8/1987 | Meek et al. ................ 250/281 |
| 4,740,698 A | | 4/1988 | Tamura et al. .............. 250/310 |
| 4,788,024 A | * | 11/1988 | Maglich et al. ............. 376/107 |
| 4,943,718 A | | 7/1990 | Haines et al. ............... 250/288 |
| 5,101,105 A | * | 3/1992 | Fenselau et al. ............ 250/281 |
| 5,104,684 A | * | 4/1992 | Tao et al. .................... 427/526 |
| 5,136,171 A | * | 8/1992 | Leung et al. ............. 250/492.2 |
| 5,528,034 A | | 6/1996 | Yamazaki et al. .......... 250/309 |
| 5,543,625 A | | 8/1996 | Johnson et al. ............. 250/427 |
| 5,561,326 A | | 10/1996 | Ito et al. ..................... 257/751 |
| 5,686,789 A | | 11/1997 | Schoenbach et al. ....... 313/491 |
| 6,288,403 B1 | | 9/2001 | Horsky et al. .............. 250/427 |
| 6,352,626 B1 | | 3/2002 | von Zweck ............ 204/298.04 |
| 6,452,338 B1 | | 9/2002 | Horsky .................. 315/111.81 |
| 2002/0070672 A1 | | 6/2002 | Horsky |
| 2003/0001095 A1 | | 1/2003 | Lo et al. |

OTHER PUBLICATIONS

Brautti et al., "Trapped Ion Source", IEEE Journal 1998, pp. 2729–2731.

Boggia et al., "Study of a Trapped Ion Source", IEEE Journal, pp. 1433–1435.

* cited by examiner

*Primary Examiner*—Don Wong
*Assistant Examiner*—Jimmy Vu
(74) *Attorney, Agent, or Firm*—Katten Muchin Rosenman; John S. Paniaguas

(57) ABSTRACT

An ion source configured for integration into both existing ion implanters used in semiconductor manufacturing and emerging ion implantation platforms. The ion source in accordance with the present invention includes the following features, all of which depart from the prior art to produce a well-focused, collimated and controllable ion beam. These features include: ionizing electron beams generated external to the ionization chamber, thereby extending the emitter lifetime; 90 degree magnetic deflection of electron beams such that no line-of-sight exists between the emitter and the process gas load, and the emitter is protected from bombardment by energetic charged particles; two opposed electron beams which can be operated simultaneously or separately; and use of a deceleration lens to adjust the final energy of the electron beam, substantially without affecting electron beam generation and deflection.

4 Claims, 5 Drawing Sheets

| DATA SET | SOURCE |
|---|---|
| —— | BEB (VERTICAL IP)<br>Y.-K. KIM, W. HWANG, N.M. WEINBERGER, M.A. ALI AND M.E. RUDD, J. CHEM. PHYS. 106, 1026 (1997) |
| ········ | BEB (ADIABATIC IP)<br>W. HWANG, Y.-K. KIM AND M.E. RUDD, J. CHEM. PHYS. 104, 2956 (1996). |
| ⬢ | N. DJURIC, D. BELIC, M. KUREPA, J.U. MACK, J. ROTHLEITNER AND T.D. MARK, ABSTRACTS, 12TH INT. CONF ON THE PHYSICS OF ATOMIC AND ELECTRIC COLLISIONS, ED. BY S DATZ (GATLINBURG, 1981), P. 384 |
| ■ | M.V.V.S. RAO AND S.K. SRIVASTAVA, J. PHYS. B 25, 2175 (1992) |

ELECTRON IMPACT ION SOURCE

CROSS-REFERENCE TO RELATED APPLICATIONS

This is a continuation of prior application Ser. No. 10/183,768, filed Jun. 26, 2002, now U.S. Pat. No. 6,686,595, which is hereby incorporated herein by reference in its entirety.

BACKGROUND OF THE INVENTION

1. Field of the Invention

The present invention relates to an ion source and more particularly to an electron impact ion source.

2. Description of the Prior Art

Ion implantation has been a key technology in semiconductor device manufacturing for more than twenty years, and is currently used to fabricate the p-n junctions in transistors, particularly in CMOS devices, such as memory and logic chips. By creating positively-charged ions containing various dopant elements, such as, $^{75}As$, $^{11}B$, $^{115}In$, $^{31}P$, or $^{121}Sb$, required for fabricating the transistors in, for example, silicon substrates, known ion implanters can selectively control both the energy (hence implantation depth) and ion current (hence dose) of ions introduced into transistor structures. Ion implanters have traditionally used ion sources which generate ribbon beams of up to about 50 mm in length. These beams are transported to the substrate at a predetermined uniform dose by electromagnetic scanning of the beam across the substrate, mechanical scanning of the substrate across the beam, or both.

So-called medium current implanters typically incorporate a serial (one wafer at a time) process chamber, which offers high tilt capability (e.g., up to 60 degrees from substrate normal). The ion beam is typically electromagnetically scanned across the wafer, in an orthogonal direction to ensure dose uniformity. In order to meet implant dose uniformity and repeatability requirements which typically allow only a few percent variance in these quantities, the ion beam should have excellent angular and spatial uniformity (angular uniformity of beam on wafer of <2 deg, for example). The production of beams possessing these characteristics imposes severe constraints on the beam transport optics of the implanter, and the commonplace use of large-emittance plasma-based ion sources often results in increased beam diameter and beam angular divergence, causing beam loss during transport due to vignetting of the beam by the various apertures present within the beam line of the implanter. Currently, the generation of high current (>1 mA) ion beams at low (<5 keV) energy is problematic in serial implanters, such that wafer throughput is unacceptably low for certain low-energy implants (for example, in the creation of source and drain structures in leading-edge CMOS processes). Similar transport problems also exist for batch implanters (processing many wafers mounted on a spinning disk) at the low beam energies of <5 keV per ion.

While it is possible to design beam transport optics which are nearly aberration-free, the ion beam characteristics (spatial extent, spatial uniformity, angular divergence and angular uniformity) are nonetheless largely determined by the emittance properties of the ion source itself (i.e., the beam properties at ion extraction which determine the extent to which the implanter optics can focus and control the beam as emitted from the ion source). Arc-discharge plasma sources currently in use have poor emittance, and therefore severely limit the ability of ion implanters to produce well-focused, collimated, and controllable ion beams. Thus, there is a need for an ion source for use in a semiconductor manufacturing which provides a well-focused, collimated and controllable ion beam.

SUMMARY OF THE INVENTION

Briefly, the present invention relates to an ion source configured for integration into both existing ion implanters used in semiconductor manufacturing and emerging ion implantation platforms, and is also suitable for use in ion dosing systems used in the processing of flat panel displays. The ion source in accordance with the present invention includes the following features, all of which depart from the prior art to produce a well-focused, collimated and controllable ion beam:

Ionizing electron beams generated external to the ionization chamber, thereby extending the emitter lifetime.

90 degree magnetic deflection of electron beams such that no line-of-sight exists between the emitter and the process gas load, and the emitter is protected from bombardment by energetic charged particles.

Two opposed electron beams which can be operated simultaneously or separately.

Use of a deceleration lens to adjust the ionization energy of the electron beam, substantially without affecting electron beam generation and deflection.

DESCRIPTION OF THE DRAWINGS

These and other advantages of the present invention will be readily understood with reference to the following specification and attached drawing wherein.

DETAILED DESCRIPTION

Figure 1:
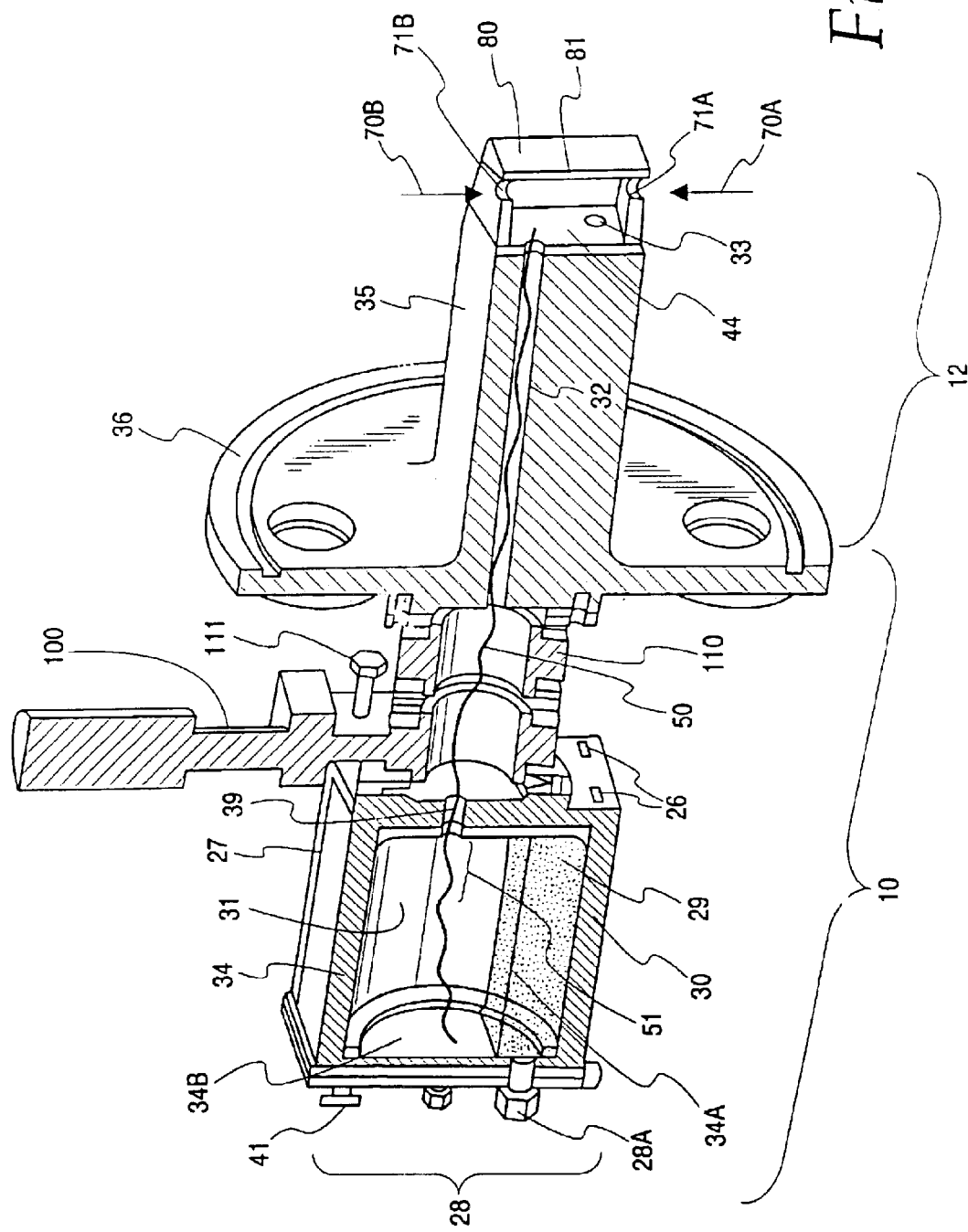
FIG. 1 is a perspective view of an ion source in accordance with the present invention, shown in cutaway to expose internal components.

The ion source which forms a part of the ion implantation system in accordance with the present invention is an electron impact ionization source. FIG. 1 is a cross-sectional schematic diagram of the ion source in accordance with the present invention which illustrates the construction and the functionality of the components which make up the ion source 10. The cross section is cut along a plane which contains the direction of propagation of the ion beam, separating the ion source in two halves. The ion source 10 includes a vaporizer 28 and a beam forming region 12 joined together by at a mounting flange 36. The ion source 10 is made to interface to an evacuated vacuum chamber of an ion implanter or other process tool by way of the mounting flange 36. Thus, the portion of the ion source 10 to the right of the flange 36 in FIG. 1 is at high vacuum (pressure <1×10$^{-4}$ Torr). Gaseous material is introduced into an ionization chamber 44 where the gas molecules are ionized by electron impact from one or more electron beams 70$a$ and 70$b$ which enter the ionization chamber 44 through a pair of opposing electron beam entrance apertures 71$a$ and 71$b$, respectively. With such a configuration, ions are created adjacent to an ion extraction aperture 81 in an ion extraction aperture plate 80. These ions are extracted and formed into an energetic ion beam by an extraction electrode (not shown) located in front of an ion extraction aperture plate 80.

Various vaporizers 28 are suitable for use with the present invention. An exemplary vaporizer 28 is illustrated in FIG. 1. The vaporizer 28 is exemplary and may be formed from a vaporizer body 30 and a crucible 31 for carrying a solid source feed material 29, for example, decaborane, $B_{10}H_{14}$. Resistive heaters may be embedded into the vaporizer body 30. Water cooling channels 26 and convective gas cooling channels 27 may be configured to be in intimate contact with the vaporizer body 30 and used to provide a uniform operating temperature above room temperature to the crucible 31. Thermal conduction between the crucible 31 and the temperature-controlled vaporizer body 30 may be provided by way of a pressurized gas, introduced by a gas feed 41 into a crucible-vaporizer body interface 34, while the temperature of the vaporizer body 31 is monitored by a thermocouple. Vaporized decaborane $B_{10}H_{14}$ or other vaporized material 50 collects in a crucible ballast volume 51 and passes through a vaporizer exit bore 39, through a pair of isolation valves 100 and 110, and through a vapor conduit 32, contained in a source block 35, and enters the ionization chamber 44 through a vapor entrance aperture 33.

The isolation valves 100, 110, mounting flange 36, and the source block 35 may also be temperature controlled to a temperature near or above the vaporizer temperature to prevent condensation of the vapor.

The ion source gas delivery system may include two conduits that feed the ionization chamber 44 from two separate sources. The first source may be a small diameter low-conductance path which feeds gaseous material from a pressurized gas source, such as a gas cylinder (not shown). The second source may be from a high-conductance path from a low-temperature vaporizer, which vaporizes solid material. Regardless of the source, the gas delivery system maintains a gas pressure of, for example, a few millitorr, in the ionization chamber 44. The vaporizer 28 maintains tight temperature control of its surfaces which are in contact with the solid material, in order to maintain a stable flow of gas into the ionization chamber, and hence a stable pressure within said chamber.

Prior to servicing the vaporizer 28, the isolation valve 110 can be closed to keep the ion source and the ion implanter under vacuum. The isolation valve 100 can also be closed to maintain containment of the vapor 50 within the crucible 31. The vaporizer 28 can then be transported safely to a chemical hood, where the crucible 31 can be recharged or cleaned. Prior to opening the valve 100, a vent valve 111, which may be welded into the body of valve 100, can be opened to bring the crucible volume to atmospheric pressure. Once service is complete, the valve 100 may be again closed and the vaporizer 28 may be mounted onto the ion source 10 by attaching the valve 100 to the valve 110, and the vent valve 111 is then connected to a roughing line to evacuate the crucible 31 and the dead volume between the valve 100 and the valve 110. The isolation valve 110 can then be opened if desired, without compromising the vacuum environment of the ion source and ion implanter.

A vaporizer assembly 30$a$ is formed by a heated and cooled vaporizer body 30 and a removable crucible 34. Access to the crucible 31 is possible by removing an end plate (not shown) on the back of the vaporizer 28. Once the crucible 31 is removed from the vaporizer 28, it can be recharged by removing its cover 34$b$ that is elastomerically sealed to the end of the crucible 31 and raising a grate 34$a$ which isolates the solid 29. After recharge, the crucible 31 is inserted in the vaporizer body 30 and a vacuum seal is made to the exit bore 39 at the front of the vaporizer body 30, to isolate the crucible ballast volume 51 from thermal transfer gas present within crucible-vaporizer body interface 34. The bore 39 is used as the exit for the vaporized gas. The mechanical fit between the crucible 31 and the vaporizer body 30 is close, in order to achieve temperature uniformity of the crucible 31. Any gap between the crucible 31 and the vaporizer body 30 may be filled with a gas to facilitate thermal transfer between the two surfaces. The thermal transfer gas enters said gap through an end plate fitting 28$a$, and may be at or near atmospheric pressure.

Figure 6:
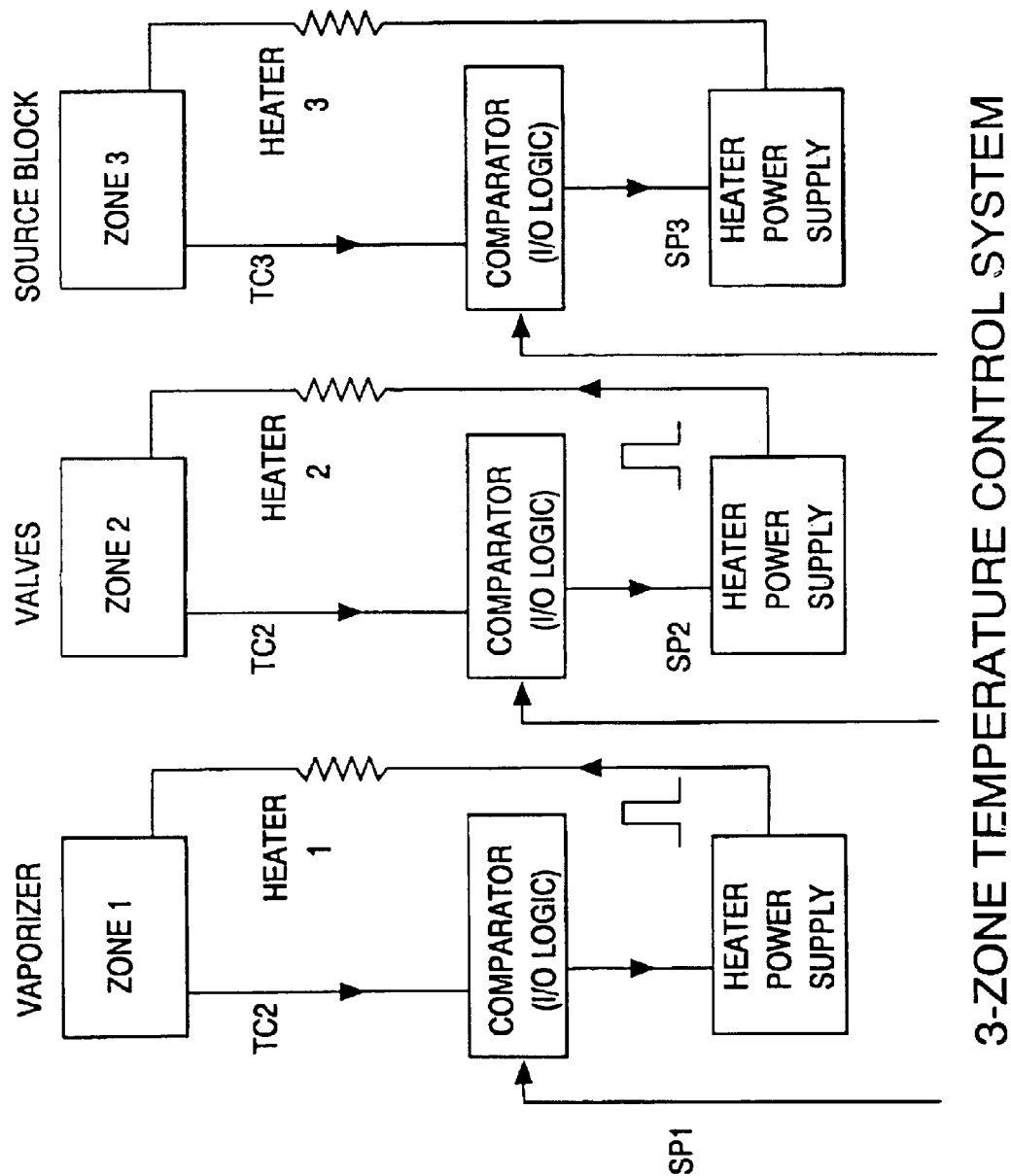
FIG. 6 is a block diagram of a temperature control system which can be used in conjunction with the present invention.

Temperature control may be performed using, for example, a proportional-integral differential (PID) closed-loop control of resistive elements that may be embedded in the vaporizer body 30. FIG. 6 shows a block diagram of a preferred embodiment in which three temperature zones are defined: zone 1 for vaporizer body 30, zone 2 for isolation valves 100 and 110, and zone 3 for the source block 35. Each zone may have a dedicated controller; for example, an Omron E5CK Digital Controller. In the simplest case, heating elements alone are used to actively control temperature above room ambient, for example, between 18 C to 300 C or higher. Thus, resistive cartridge-type heaters can be embedded into the vaporizer body 30 (heater 1) the and the source block 35 (heater 3), while the valves 100, 110 can be wrapped with silicone strip heaters (heater 2) in which the resistive elements are wire or foil strips. Three thermocouples labeled TC1, TC2, and TC3 in FIG. 6 can be embedded into each of the three components 30, 35, 100 (110) and continuously read by each of the three dedicated temperature controllers. The temperature controllers 1, 2, and 3 are user-programmed with a temperature setpoint SP1, SP2, and SP3, respectively. In one embodiment, the temperature setpoints are such that SP3>SP2>SP1. For example, in the case where the vaporizer temperature is desired to be at 30 C, SP2 might be 50 C and SP3 70 C. The controllers typically operate such that when the TC readback does not match the setpoint, the controller's comparator initiates cooling or heating as required. For example, in the case where only heating is used to vary temperature, the comparator output is zero unless TC1<SP1. The controllers may contain a look-up table of output power as a nonlinear function of temperature difference SP1−TC1, and feed the appropriate signals to the controller's heater power supply in order to smoothly regulate temperature to the programmed setpoint value. A typical method of varying heater power is by pulse-width modulation of the power supply. This technique can be used to regulate power between 1% and 100% of full scale. Such PID controllers can typically hold temperature setpoint to within 0.2 C.

The vaporizer body material may be selected to be highly thermally conductive to maintain temperature uniformity. A small thermal leak may be intentionally applied to the vaporizer body 30 to improve control system stability and reduce settling time by using air channels located on the outside surface of the vaporizer body 30. The air channels 27 surround the vaporizer body 30 and are covered by plates (not shown). Air may be ducted to the channels within a manifold system, integrated into a vaporizer end plate (not shown) to provide moderate, continuous convective cooling. The air is fed through the inlet after proceeding past a metering valve used for flow control. The air discharges from the air assembly into house exhaust.

In addition to air cooling, provisions may also be provided for liquid cooling the vaporizer body 30. For example, a coolant may be ducted through a, for example, 1 meter long, 6 mm diameter bore that travels back and forth throughout the vaporizer body 30. Connections may be made through fittings mounted to the body ports 26. The liquid cooling provides rapid cooling of the vaporizer assembly to provide quick service turnaround when required.

Gases may be fed into the ionization chamber 44 via a gas conduit 33, for example, from a pressurized gas cylinder. Solid feed materials can be vaporized in the vaporizer 28, and the vapor fed into ionization chamber 44 through the vapor conduit 32, described above. Solid feed material 29, located under the perforated separation barrier 34a, is held at a uniform temperature by temperature control of the vaporizer body 30, as discussed above. Vapor 50 which accumulates in ballast volume 31 feeds through the bore 39 and through the shutoff valves 100 and 110 and, in turn, is fed into the ionization chamber 44 by way of a vapor conduit 32, located in the source block 35. Thus, both gaseous and solid dopant-bearing materials may be ionized by this ion source.

Figure 2:
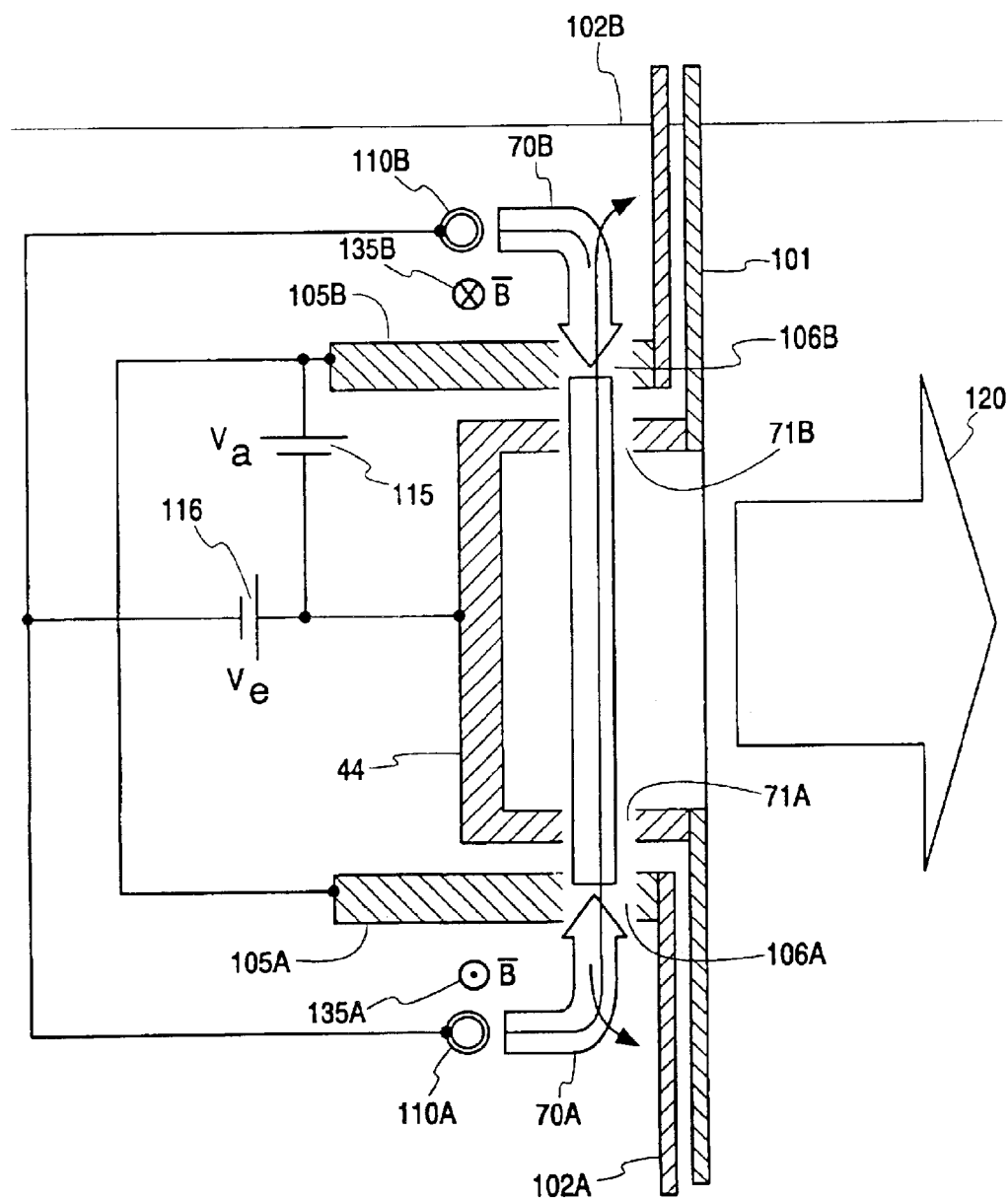
FIG. 2 is a side view of a portion of the ion source shown in FIG. 1, shown in cutaway with the electron beams and magnetic fields shown superimposed thereupon.

FIG. 2 is a cross-sectional side view which illustrates the fundamental optical design of a multiple electron-beam ion source configuration in accordance with the present invention. In one embodiment of the invention, a pair of spatially separate electron beams 70a and 70b are emitted from a pair of spatially separate heated filaments 110a and 110b and execute 90 degree trajectories due to the influence of beam steerers or static magnetic fields B 135a and 135b (in a direction normal to the plane of the paper as indicated) into the ionization chamber 44, passing first through a pair of base plate apertures 106a and 106b and a pair of spaced apart base plates 105a and 105b, and then through a pair of electron entrance apertures 71a and 71b. Electrons passing all the way through the ionization chamber 44 (i.e., through both of the electron entrance apertures 71a and 71b) are bent toward a pair of emitter shields 102a and 102b by the beam steerers, or static magnetic fields 135a and 135b. As the electron beams propagate through the base plate apertures 106a and 106b, they are decelerate prior to entering ionization chamber 44 by the application of a voltage Va to the base plates 105a and 105b (provided by positive-going power supply 115), and voltage Ve to the filaments 135a and 135b (provided by negative-going power supply 116). It is important to maintain electron beam energies significantly higher than typically desired for ionization in the beam-forming and the transport region, i.e., outside of ionization chamber 44. This is due to the space charge effects which severely reduce the beam current and enlarge the electron beam diameter at low energies. Thus, it is desired to maintain the electron beam energies between about 1.5 keV and 5 keV in this region.

Voltages are all relative to the ionization chamber 44. For example, if Ve=−0.5 kV and Va=1.5 kV, the energy of the electron beam is therefore given by e(Va−Ve), where e is the electronic charge ($6.02 \times 10^{-19}$ Coulombs). Thus, in this example, the electron beam 70a, 70b is formed and deflected at an energy of 2 keV, but upon entering electron entrance aperture 71a, 71b it has an energy of only 0.5 keV.

The following table gives approximate values of magnetic field B required to bend an electron beam with energy E through 90 degrees.

TABLE 1

Dependence of Magnetic Field Strength on Electron Energy to Accomplish a 90 Degree Deflection in the Present Invention

| Electron Energy E | Magnetic Field B |
| --- | --- |
| 1500 eV | 51 G |
| 2000 eV | 59 G |
| 2500 eV | 66 G |

Other elements shown in FIG. 2 include an extracted ion beam 120, a source electrostatic shield 101, and a pair of emitter shields 102a and 102b. These emitter shields 102a and 102b serve two purposes: to provide shielding from electromagnetic fields, and to provide shielding from stray electron or ion beams. For example, the emitter shields 102a and 102b shield the electron beams 70a and 70b from fields associated with the potential difference between base plates 105a and 105b and the source shield 101, and also acts as a dump for stray electron beams from the opposing electron emitter. The source shield 101 shields the ion beam 120 from fields generated by the potential difference between base plates 105a and 105b and the ionization chamber 44, and also acts to absorb stray electrons and ions which would otherwise impact the ion source elements. For this reason, both of the emitter shields 102a and 102b, as well as the source shield 101, are constructed of refractory metal, such as molybdenum or graphite. Alternatively, more complete shielding of the ion beam 120 from the magnetic fields B 135a and 135b may be accomplished by constructing the source shield 101 of a ferromagnetic substance, such as magnetic stainless steel.

Figure 3:
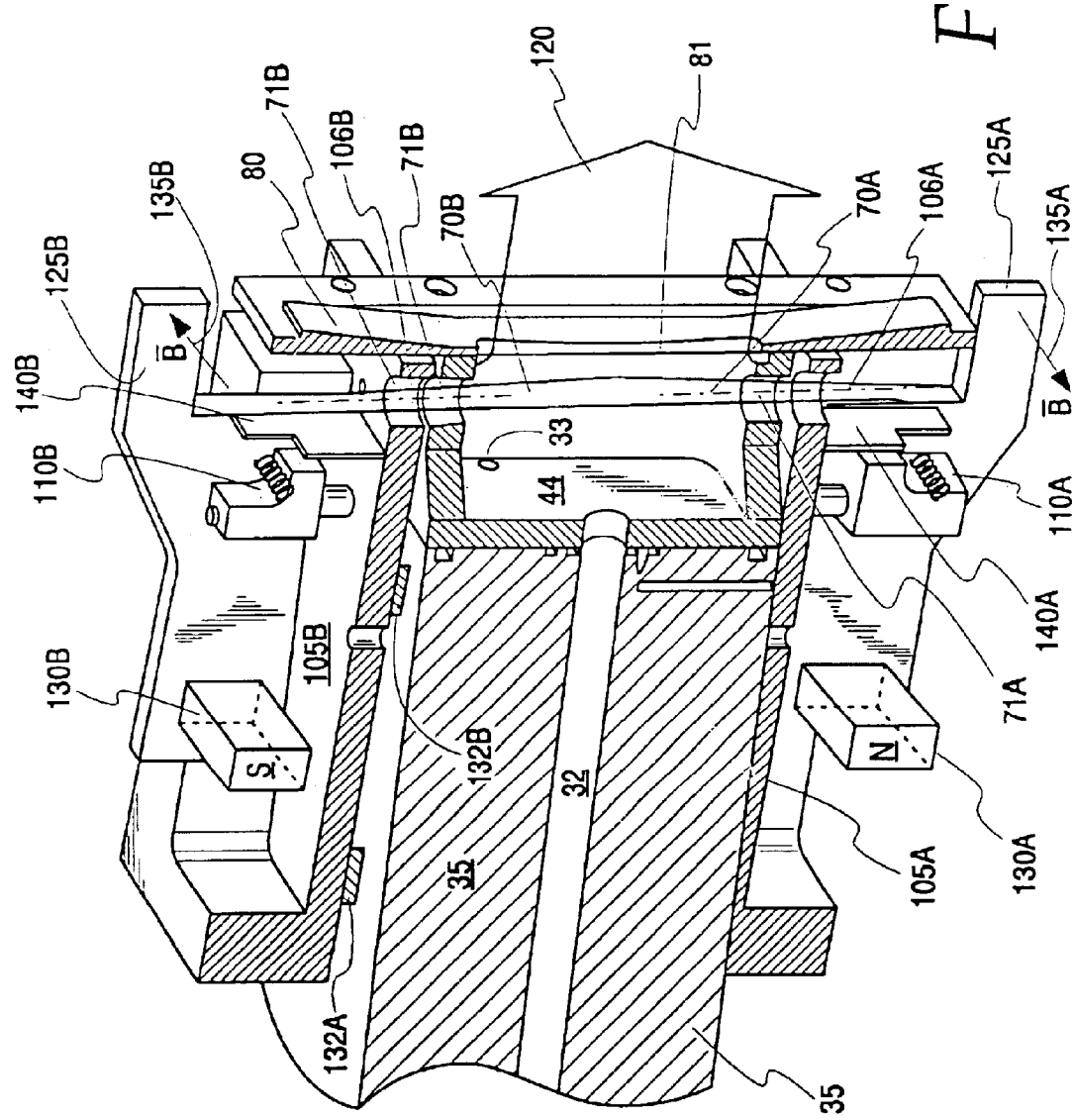
FIG. 3 is a perspective view of a portion of the ion source shown in cutaway which illustrates the magnetic field and electron beam sources in accordance with the present invention.

FIG. 3 is a cutaway view illustrating the mechanical detail and which shows explicitly how the contents of FIG. 2 are incorporated into the ion source of FIG. 1. Electrons are thermionically emitted from one or more of the filaments 110a and 110b and accelerated to a pair of corresponding anodes 140a and 140b forming the electron beams 70a and 70b. Such a configuration offers several benefits. First, the filaments 110a and 110b can be operated separately or together. Second, since the electron beams 70a, 70b are generated external to the ionization chamber, the emitter life is extended relative to known configurations, since the emitter is in the low-pressure environment of the implanter vacuum housing in watch the ion source resides, and since the emitter is also effectively protected from ion bombardment.

Magnetic flux from a pair of permanent magnets 130a and 130b and a pair of magnetic pole assemblies 125a and 125b is used to form beam steerers used to establish uniform magnetic fields across the air gap between the ends of the magnetic pole assemblies 125a, 125b, wherein the electron beam 70a, 70b propagates. The magnetic fields 135a and 135b and the electron beam energies of electron beams 70a and 70b are matched such that electron beams 70a and 70b are deflected 90 degrees, and pass into the ionization chamber 44 as shown. By deflecting the electron beams 70a and 70b, for example, through 90 degrees, no line of sight exists between the emitters and the ionization chamber 44 which contains the ions, thus preventing bombardment of the emitters by energetic charged particles.

Since Va is positive relative to the ionization chamber 44, the electron beams 70 are decelerated as they pass through the gap defined by base plate apertures 106a and 106b and the electron entrance apertures 71a and 71b. Thus, the combination of the base plate aperture 106a and electron entrance aperture 71a, and baseplate aperture 106b and electron entrance aperture 71b, and the gaps between them, each forms an electrostatic lens, in this case, a decelerating lens. The use of a decelerating lens allows the ionization energy of the electron beam to be adjusted without substantially affecting the electron beam generation and deflection.

The gap may be established by one or more ceramic spacers 132a and 132b, which support each base plate 105a and 105b and act as a stand off from the source block 35, which is at ionization chamber potential. The ceramic spacers 132a and 132b provide both electrical isolation and mechanical support. Note that for clarity, the emitter shields 102 and the source shield 101 are not shown in FIG. 3.

Since the electron entrance apertures 106a and 106b can limit transmission of the electron beams, the baseplates 105a and 105b can intercept a portion of the energetic electron beams 70a, 70b. The baseplates 105a, 105b must therefore be either actively cooled, or passively cooled. Active cooling may be accomplished by passing liquid coolant, such as water, through the baseplates. Alternatively, passive cooling may be accomplished by allowing the baseplates to reach a temperature whereby they cool through radiation to their surroundings. This steady-state temperature depends on the intercepted beam power, the surface area and emissivity of the baseplates, and the temperatures of surrounding components. Allowing the baseplates 105a, 105b to operate at elevated temperature, for example at 200 C, may be advantageous when running condensable gases which can form contaminating and particle-forming films on cold surfaces.

Figure 4:
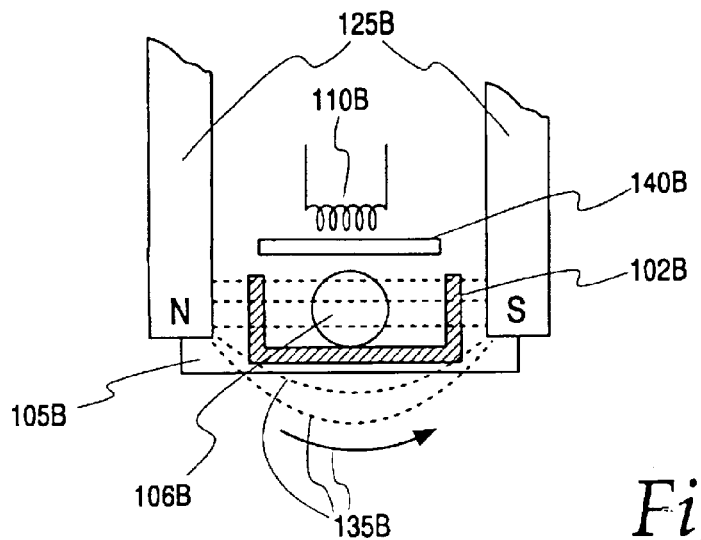
FIG. 4 is a simplified top view of the electron beam forming region of the ion source in accordance with the present invention.

FIG. 4 shows a simplified top view of the electron beam-forming region of the source. The filament 110b is at potential Ve, for example, −0.5 keV with respect to the ionization chamber 44 (FIG. 3), and the anode 140b, the magnetic pole assembly 125b, the base plate 105b, and the emitter shield 102b are all at anode potential Va, for example, 1.5 keV. Thus, the electron beam energy is 2 keV. The electron beam 70b is deflected by the magnetic field 135b in the air gap between the poles of the magnetic pole assembly 125b, such that the electron beam 70b passes through the base plate aperture 106b. Typical values for the base plate apertures 106a and 106b and the electron entrance apertures 71a and 71b are 1 cm in diameter, respectively.

Figure 5:
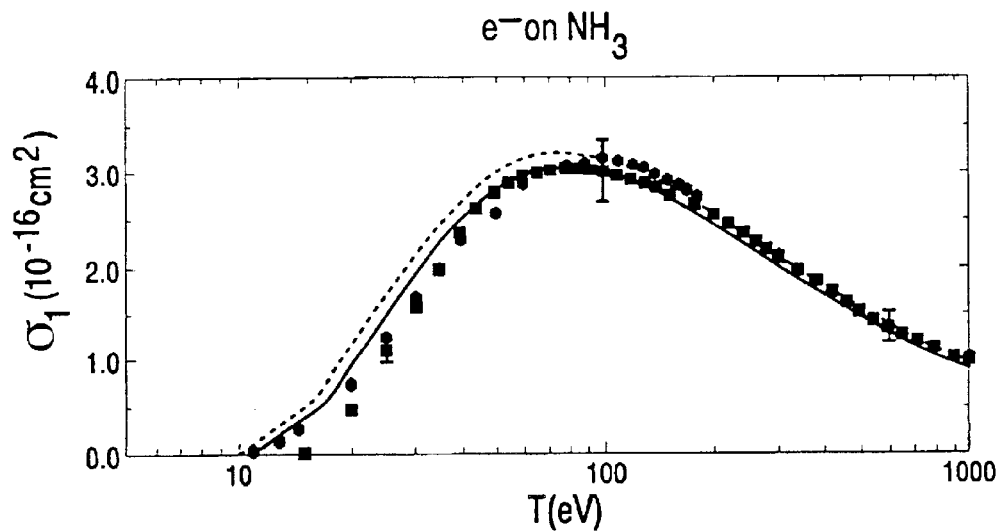
FIG. 5 is a graphical illustration of the ionization cross section σ as a function of electron energy T of ammonia ($NH_3$).

FIG. 5 illustrates how ionization probability depends on the electron energy for electron impact ionization. Ammonia ($NH_3$) is used as an illustration. Probability is expressed as cross section a, in units of $10^{-16}$ cm$^2$. Electron energy (T) is in eV, i.e., electron-volts. Shown are two sets of theoretical curves marked BEB (vertical IP) and BEB (adiabatic IP) calculated from first principles, and two sets of experimental data, from Djuric et al. (1981) and from Rao and Srivastava (1992). FIG. 5 illustrates the fact that certain ranges of electron energies produce more ionization than in other energy ranges. In general, cross sections are highest for electron impact energies between about 50 eV and 500 eV, peaking at about 100 eV. Thus, the energy with which the electron beams enter the ionization chamber 44 is an important parameter which affects the operation of the ion source of the present invention. The features shown in FIG. 2 through FIG. 4 show how the present invention incorporates electron optics which allow for broad control of electron impact ionization energy while operating at nearly constant conditions in the electron beam-forming and deflection regions of the ion source.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

1. An ion source comprising:
   an ionization chamber, said ionization chamber including a vapor entrance aperture for receiving gaseous feed material, an extraction aperture for emitting an ionized beam and one or more electron entrance apertures, each of said one or more electron entrance apertures being disposed in a plane;
   one or more electron beam sources for generating one or more electron beams, each of said one or more electron beam sources disposed to generate one or more electron beams in a direction generally parallel to the plane of its respective electron entrance aperture; and
   one or more beam steerers for bending said one or more electron beams so that said one or more electron beams travel in a direction to be received in said one or more electron entrance apertures.

2. The ion source as recited in claim 1, wherein each of said beam steerers includes a magnetic field source configured to generate a magnetic field in a direction generally perpendicular to said electron beam.

3. The ion source as recited in claim 2, wherein at least one of said one or more electron beam sources is a filament.

4. The ion source as recited in claim 1, wherein at least one of said one or more magnetic field sources includes a permanent magnet.

* * * * *